(12) United States Patent
Yamaguchi et al.

(10) Patent No.: US 12,068,384 B2
(45) Date of Patent: Aug. 20, 2024

(54) SEMICONDUCTOR DEVICE

(71) Applicant: Mitsubishi Electric Corporation, Tokyo (JP)

(72) Inventors: Yutaro Yamaguchi, Tokyo (JP); Tomohiro Otsuka, Tokyo (JP); Masatake Hangai, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 390 days.

(21) Appl. No.: 17/315,680

(22) Filed: May 10, 2021

(65) Prior Publication Data
US 2021/0265473 A1 Aug. 26, 2021

Related U.S. Application Data

(63) Continuation of application No. PCT/JP2018/044221, filed on Nov. 30, 2018.

(51) Int. Cl.
*H01L 29/06* (2006.01)
*H01L 23/482* (2006.01)
*H01L 23/66* (2006.01)
*H01L 29/423* (2006.01)
*H01L 29/80* (2006.01)

(52) U.S. Cl.
CPC .... *H01L 29/42316* (2013.01); *H01L 23/4821* (2013.01); *H01L 23/4824* (2013.01); *H01L 23/66* (2013.01); *H01L 29/0692* (2013.01); *H01L 29/802* (2013.01)

(58) Field of Classification Search
CPC ........... H01L 29/42316; H01L 23/4821; H01L 23/4824; H01L 23/66; H01L 29/0692; H01L 29/802
See application file for complete search history.

(56) References Cited

U.S. PATENT DOCUMENTS

| 5,185,534 A | 2/1993 | Sakamoto et al. | |
|---|---|---|---|
| 6,900,482 B2 * | 5/2005 | Aoki | H01L 29/42316 257/256 |
| 9,786,660 B1 * | 10/2017 | Farrell | H01L 29/404 |

(Continued)

FOREIGN PATENT DOCUMENTS

| CN | 110310991 A | * | 10/2019 | ........... H01L 27/088 |
|---|---|---|---|---|
| JP | 4-171734 A | | 6/1992 | |

(Continued)

OTHER PUBLICATIONS

Office Action dated Nov. 4, 2022 issued in corresponding European Patent Application No. 18 941 922.9.

(Continued)

*Primary Examiner* — Eduardo A Rodela
(74) *Attorney, Agent, or Firm* — Birch, Stewart, Kolasch & Birch, LLP

(57) ABSTRACT

Gate fingers extending symmetrically from both sides of gate connecting portions, drain electrodes adjacent to both the gate fingers extending from both the sides of the gate connecting portions, and source electrodes respectively adjacent to the gate fingers extending from both the sides of the gate connecting portions are included. Gate air bridges connect the gate connecting portions and a gate routing line while straddling the source electrodes.

2 Claims, 7 Drawing Sheets

(56) References Cited

U.S. PATENT DOCUMENTS

| | | | |
|---|---|---|---|
| 10,388,862 B1* | 8/2019 | Yang | H10N 50/10 |
| 2002/0140024 A1 | 10/2002 | Aoki et al. | |
| 2011/0102077 A1* | 5/2011 | Lamey | H01L 29/78 |
| | | | 327/594 |
| 2012/0012908 A1 | 1/2012 | Matsunaga | |
| 2012/0267795 A1* | 10/2012 | Shimura | H01L 23/4821 |
| | | | 257/776 |
| 2017/0125567 A1* | 5/2017 | Yamada | H01L 29/66462 |
| 2017/0271497 A1 | 9/2017 | Fayed et al. | |

FOREIGN PATENT DOCUMENTS

| | | |
|---|---|---|
| JP | 5-251478 A | 9/1993 |
| JP | 6-151465 A | 5/1994 |
| JP | 2002-299351 A | 10/2002 |
| JP | 2009-123932 A | 6/2009 |
| WO | WO 2010/113779 A1 | 10/2010 |

OTHER PUBLICATIONS

Extended European Search Report dated Jan. 11, 2022 issued in corresponding European Patent Application No. 18 941 922.9.
Supplementary Partial European Search Report dated Oct. 8, 2021 issued in corresponding European Patent Application No. 18 941 922.9.
International Search Report for PCT/JP2018/044221 filed on Nov. 30, 2018, mailed on Feb. 26, 2019.

* cited by examiner

SEMICONDUCTOR DEVICE

CROSS REFERENCE TO RELATED APPLICATION

This application is a Continuation of PCT International Application No. PCT/JP2018/044221, filed on Nov. 30, 2018, which is hereby expressly incorporated by reference into the present application.

TECHNICAL FIELD

The present invention relates to a semiconductor device.

BACKGROUND ART

A multi-finger transistor is typically used for high-frequency power amplifiers. In multi-finger transistors, for example, gate fingers, drain electrodes, and source electrodes are alternately arranged in parallel, as described in Patent Literature 1.

CITATION LIST

Patent Literature

Patent Literature 1: WO 2010/113779

SUMMARY OF INVENTION

Technical Problem

In conventional multi-finger transistors, typically, when the gate fingers are designed to be longer, since the current increases, the output power increases. However, a problem is that in the case in which the gate fingers are designed to be longer, the input voltage amplitude becomes nonuniform within each gate finger under the influence of the parasitic resistance and the inductance components of the gate fingers, and therefore the density of output power which is the output power per millimeter of each gate finger is reduced.

The present invention is made to solve the above-described problem, and it is therefore an object of the present invention to obtain a semiconductor device that can suppress the reduction in the density of output power.

Solution to Problem

A semiconductor device according to the present invention includes: a semiconductor layer disposed on a substrate; at least one gate connecting portion disposed on the semiconductor layer; a plurality of gate fingers extending symmetrically from both sides of the at least one gate connecting portion; a drain electrode adjacent to both one of the plurality of gate fingers which extends from a first side of the at least one gate connecting portion and another one of the plurality of gate fingers which extends from a second side of the at least one gate connecting portion, the second side being opposite to the first side; a plurality of source electrodes respectively adjacent to a gate finger among the plurality of gate fingers extending from the first side of the at least one gate connecting portion and another gate finger among the plurality of gate fingers extending from the second side of the at least one gate connecting portion; a gate routing line via which electric power to be inputted to the plurality of gate fingers is transmitted; a gate air bridge connecting the at least one gate connecting portion and the gate routing line while straddling a source electrode among the plurality of source electrodes adjacent to said another gate finger extending from the second side of the at least one gate connecting portion; and a metal layer disposed under each of the plurality of source electrodes and having etching resistance higher than etching resistance of the plurality of source electrodes.

Advantageous Effects of Invention

According to the present invention, the multiple gate fingers extending symmetrically from both the sides of the gate connecting portion, the drain electrode adjacent to both the gate fingers extending from both the sides of the gate connecting portion, and the multiple source electrodes individually adjacent to the gate fingers extending from both the sides of the gate connecting portion are included, and the gate air bridge connects the gate connecting portion and the gate routing line while straddling a source electrode. In conventional semiconductor devices, typically, the length of each gate finger is equal to the total of the lengths of the two gate fingers extending from both the sides of the gate connecting portion. As described above, because in the semiconductor device according to the present invention the length of each gate finger is shorter than that in the conventional semiconductor devices, the amplitude of an input voltage within each gate finger is made uniform in accordance with the reduction in the length, and the reduction in the density of output power is suppressed.

DESCRIPTION OF EMBODIMENTS

Embodiment 1

Figure 1:
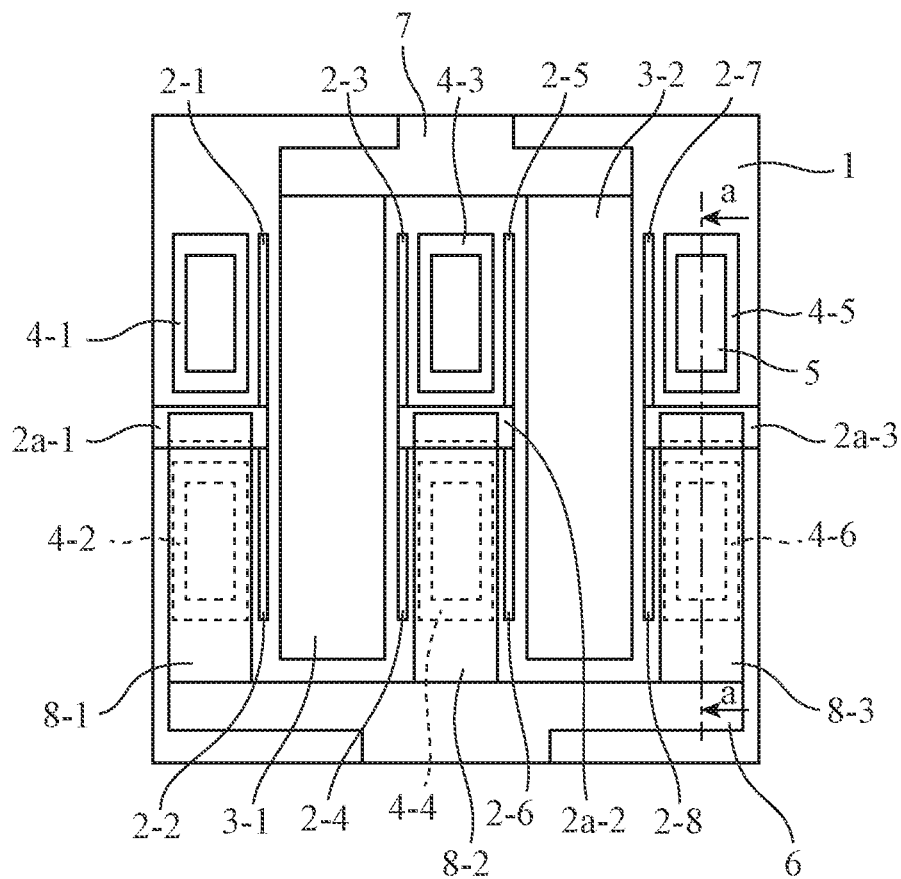
FIG. 1 is a top view showing an example of the structure of a semiconductor device according to Embodiment 1.
Figure 2:
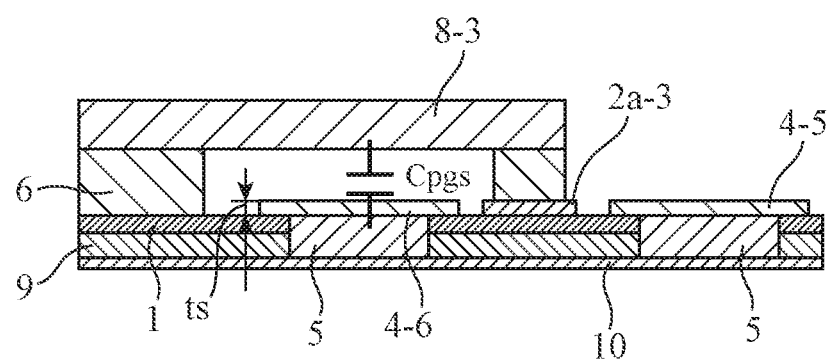
FIG. 2 is a cross-sectional view on arrow showing a cross section of the semiconductor device of FIG. 1, taken along the line a-a.

FIG. 1 is a top view showing an example of the structure of a semiconductor device according to Embodiment 1. FIG. 2 is a cross-sectional view on arrow showing a cross section of the semiconductor device of FIG. 1, taken along the line a-a. The semiconductor device shown in FIG. 1 is a multi-finger transistor, and includes a semiconductor layer 1, gate fingers 2-1 to 2-8, gate connecting portions 2a-1 to 2a-3, drain electrodes 3-1 and 3-2, source electrodes 4-1 to 4-6, vias 5, a gate routing line 6, a drain routing line 7, gate air bridges 8-1 to 8-3, a substrate 9, and a ground layer 10.

The semiconductor layer 1 is formed on one surface of the substrate 9 and the ground layer 10 is formed on another surface of the substrate 9, as shown in FIG. 2. The gate connecting portions 2a-1 to 2a-3 are formed on the semiconductor layer 1, and are parallel arranged in a line. As shown in FIG. 1, the gate finger 2-1 and the gate finger 2-2 are multiple gate fingers extending symmetrically from both sides of the gate connecting portion 2a-1. The gate fingers 2-3 and 2-5 and the gate fingers 2-4 and 2-6 are multiple gate fingers extending symmetrically from both sides of the gate connecting portion 2a-2. The gate finger 2-7 and the gate finger 2-8 are multiple gate fingers extending symmetrically from both sides of the gate connecting portion 2a-3.

The side of the gate connecting portion 2a-1 from which the gate finger 2-1 extends, the side of the gate connecting portion 2a-2 from which the gate fingers 2-3 and 2-5 extend, and the side of the gate connecting portion 2a-3 from which the gate finger 2-7 extends are referred to as the "first sides."

The side of the gate connecting portion 2a-1 from which the gate finger 2-2 extends, the side of the gate connecting portion 2a-2 from which the gate fingers 2-4 and 2-6 extend, and the side of the gate connecting portion 2a-3 from which the gate finger 2-8 extends, i.e. the sides opposite to the first sides are referred to as the "second sides."

The drain electrode 3-1 is a belt-shaped electrode adjacent to both the gate finger 2-1 extending from the first side of the gate connecting portion 2a-1 and the gate finger 2-2 extending from the second side of the gate connecting portion 2a-1, and adjacent to both the gate finger 2-3 extending from the first side of the gate connecting portion 2a-2 and the gate finger 2-4 extending from the second side of the gate connecting portion 2a-2.

The drain electrode 3-2 is a belt-shaped electrode adjacent to both the gate finger 2-5 extending from the first side of the gate connecting portion 2a-2 and the gate finger 2-6 extending from the second side of the gate connecting portion 2a-2, and adjacent to both the gate finger 2-7 extending from the first side of the gate connecting portion 2a-3 and the gate finger 2-8 extending from the second side of the gate connecting portion 2a-3. The drain electrodes 3-1 and 3-2 are connected to the drain routing line 7.

The source electrodes 4-1 to 4-6 are individually adjacent to the gate fingers 2-1 to 2-8 extending from both the sides of the gate connecting portions 2a-1 to 2a-3. For example, as shown in FIG. 1, the source electrode 4-1 is adjacent to the gate finger 2-1, and the source electrode 4-2 is adjacent to the gate finger 2-2. The source electrode 4-3 is adjacent to the gate fingers 2-3 and 2-5, and the source electrode 4-4 is adjacent to the gate fingers 2-4 and 2-6. The source electrode 4-5 is adjacent to the gate finger 2-7, and the source electrode 4-6 is adjacent to the gate finger 2-8.

Each of the source electrodes 4-1 to 4-6 is electrically connected to the ground layer 10 of the substrate 9 by a via 5. The gate routing line 6 is formed on the semiconductor layer 1, and electric power to be supplied to the gate fingers 2-1 to 2-8 is inputted to the gate routing line 6. The drain routing line 7 is formed on the semiconductor layer 1, and electric power from the drain electrodes 3-1 and 3-2 is outputted to the drain routing line 7.

The gate air bridge 8-1 connects the gate connecting portion 2a-1 and the gate routing line 6 while straddling the source electrode 4-2 adjacent to the gate finger 2-2 extending from the second side of the gate connecting portion 2a-1. The gate air bridge 8-2 connects the gate connecting portion 2a-2 and the gate routing line 6 while straddling the source electrode 4-4 adjacent to the gate fingers 2-4 and 2-6 extending from the second side of the gate connecting portion 2a-2. The gate air bridge 8-3 connects the gate connecting portion 2a-3 and the gate routing line 6 while straddling the source electrode 4-6 adjacent to the gate finger 2-8 extending from the second side of the gate connecting portion 2a-3.

The gate air bridges 8-1 to 8-3 are made of a conductive material, and the electric power to be inputted to the gate fingers 2-1 to 2-8 is transmitted via the gate air bridges 8-1 to 8-3. The electric power transmitted to the gate routing line 6 is inputted to the gate fingers 2-1 and 2-2 via the gate air bridge 8-1, is inputted to the gate fingers 2-3 to 2-6 via the gate air bridge 8-2, and is inputted to the gate fingers 2-7 and 2-8 via the gate air bridge 8-3.

Air gaps are formed between the source electrode 4-2 and the gate air bridge 8-1, between the source electrode 4-4 and the gate air bridge 8-2, and between the source electrode 4-6 and the gate air bridge 8-3, respectively, in such a way as to prevent each of the source electrodes 4-2, 4-4, and 4-6 and the corresponding one of the gate air bridges 8-1, 8-2, and 8-3 being short-circuited. Therefore, capacitance Cpgs's are formed between the source electrode 4-2 and the gate air bridge 8-1, between the source electrode 4-4 and the gate air bridge 8-2, and between the source electrode 4-6 and the gate air bridge 8-3, respectively, as shown in FIG. 2. Because the capacitance Cpgs has a bad influence on the high frequency characteristics of the semiconductor device, it is desirable to reduce the capacitance as much as possible. Accordingly, the thickness ts of each of the source electrodes is made as thin as possible. As a result, the distance between each of the source electrodes and the corresponding gate air bridge is lengthened, and the capacitance Cpgs is reduced.

Figure 3A:
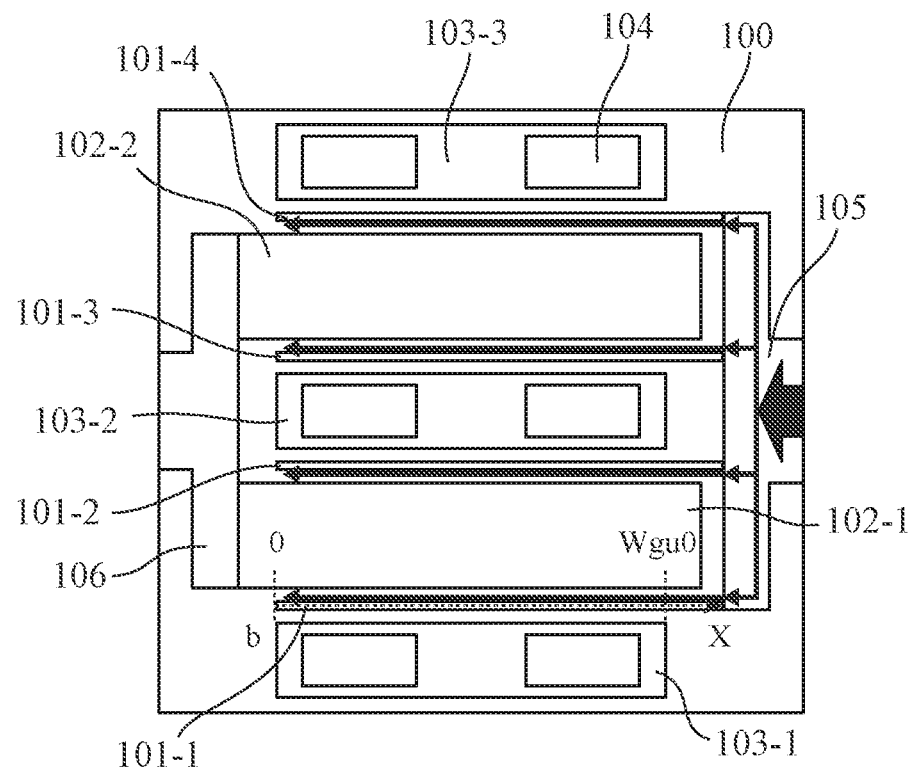
FIG. 3A is a top view showing the structure of a conventional semiconductor device.

FIG. 3A is a top view showing the structure of a conventional semiconductor device. The semiconductor device shown in FIG. 3A is a multi-finger transistor having a conventional typical structure, and includes a semiconductor layer 100, gate fingers 101-1 to 101-4, drain electrodes 102-1 and 102-2, source electrodes 103-1 to 103-3, vias 104, a gate routing line 105, and a drain routing line 106. The semiconductor layer 100 is formed on one surface of a substrate and a ground layer is formed on another surface of this substrate, like in the case of the semiconductor device shown in FIG. 2. Each of the source electrodes 103-1 to 103-3 is electrically connected to the ground layer by a via 104.

The gate fingers 101-1 to 101-4 are arranged in the shape of comb teeth on the semiconductor layer 100, and one end of each of the gate fingers is connected to the gate routing line 105. Each of the drain electrodes 102-1 to 102-2 is a belt-shaped electrode arranged between adjacent gate fingers, and one end of each of the drain electrodes is connected to the drain routing line 106. The source electrode 103-1 is arranged adjacent to the gate finger 101-1, the source electrode 103-2 is arranged adjacent to the gate fingers 101-2 and 101-3, and the source electrode 103-3 is arranged adjacent to the gate finger 101-4.

Electric power inputted to the gate routing line 105 is transmitted to the gate fingers 101-1 to 101-4 along input power transmission paths shown by arrows in FIG. 3A. The length of each of the gate fingers 101-1 to 101-4 is denoted by Wgu0. The length Wgu0 is equal to the length of a portion of each of the gate fingers 101-1 to 101-4, the portion facing the corresponding one of the source electrodes 103-1 to 103-3. The total of the lengths of the gate fingers 101-1 to 101-4 (referred to as the total finger length hereinafter) is denoted by Wgt(=Wgu0×4=4Wgu0).

Figure 3B:
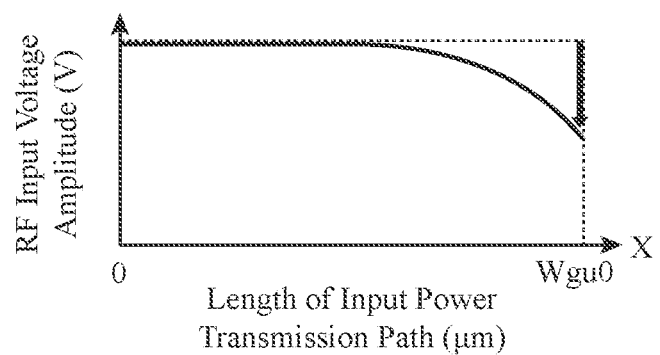
FIG. 3B is a graph showing a relation between the length of each input power transmission path and an input voltage amplitude in the semiconductor device of FIG. 3A.

FIG. 3B is a graph showing a relation between the length of each input power transmission path and the amplitude of an input voltage in the semiconductor device of FIG. 3A. In FIG. 3B, the length of each input power transmission path is equal to the length from the gate routing line 105 to a point b which is the open end of a gate finger connected to the gate routing line 105. Further, the length of each of the gate fingers 101-1 to 101-4 is equal to the length Wgu0 from the point b of the gate finger to an end point on a root side of a portion in the gate finger, the portion facing a source electrode.

When it is defined in FIGS. 3A and 3B that the X axis direction shows the direction of the length of each input power transmission path, the point b is at X=0 and the end point on the root side of the portion in each of the gate fingers, the portion facing a source electrode, is at X=Wgu0. The amplitude of the input voltage is the amplitude (referred to as the RF input voltage amplitude hereinafter) of a high frequency signal at the point b within each of the gate fingers.

As shown by an arrow in FIG. 3B, the RF input voltage amplitude becomes gradually smaller from the point b of each of the gate fingers toward the root side of the gate finger. As the length Wgu1 of each of the gate fingers becomes long, this tendency becomes remarkable and the degree of nonuniformity becomes large. As described above, in the conventional semiconductor device, the input voltage amplitude within each of the gate fingers does not become uniform under the influence of the parasitic resistor and inductance of the gate finger, and the longer each of the gate fingers is, the smaller the density of output power becomes. The output power density is the output power per millimeter of each of the gate fingers, as mentioned above.

Figure 4A:
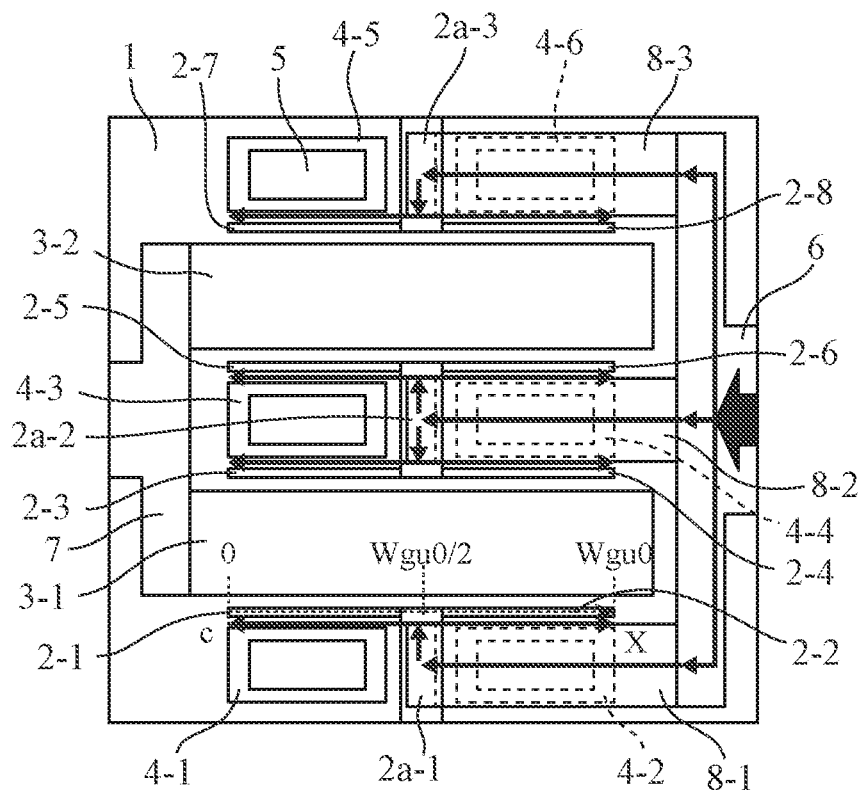
FIG. 4A is a top view showing an example of the structure of the semiconductor device according to Embodiment 1.

FIG. 4A is a top view showing an example of the structure of the semiconductor device according to Embodiment 1. The semiconductor device shown in FIG. 4A is the multi-finger transistor shown in FIG. 1. The gate finger 2-1 and the gate finger 2-2 extend symmetrically from both the sides of the gate connecting portion 2a-1, and the gate fingers 2-3 and 2-5 and the gate fingers 2-4 and 2-6 symmetrically extend from both the sides of the t gate connecting portion 2a-2. The gate finger 2-7 and the gate finger 2-8 extend symmetrically from both the sides of the gate connecting portion 2a-3. The source electrodes 4-1 to 4-6 are individually adjacent to the gate fingers 2-1 to 2-8 extending from both the sides of the gate connecting portions 2a-1 to 2a-3.

The electric power inputted to the gate routing line 6 is transmitted to the gate fingers 2-1 to 2-8 along input power transmission paths passing through the gate air bridges 8-1 to 8-3 and the gate connecting portions 2a-1 to 2a-3, as shown by arrows in FIG. 4A. Here, the length of each of the gate fingers 2-1 to 2-8 is denoted by Wgu1. For example, the length Wgu1 is the length from the open end of each of the gate fingers to a center point of the corresponding gate connecting portion. The center point of each of the gate connecting portions is a point of a part of the gate connecting portion, the part facing a drain electrode and the point being the one through which an axis of symmetry between a gate finger on the first side and a gate finger on the second side passes.

The length of a portion in each of the gate fingers, the portion facing a source electrode, has an influence on the characteristics of the transistor. Therefore, the length Wgu0 of each of the gate fingers of the conventional semiconductor device shown in FIG. 3A can be approximated as the total (Wgu1×2) of the lengths of two gate fingers shown in FIG. 4A extending from both the sides of the corresponding gate connecting portion. In this case, the length Wgu1 of each of the gate fingers 2-1 to 2-8 is Wgu1=Wgu0/2.

Figure 4B:
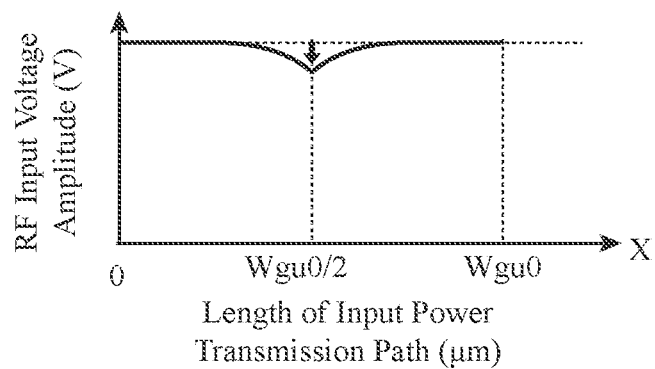
FIG. 4B is a graph showing a relation between the length of each input power transmission path and an input voltage amplitude in the semiconductor device of FIG. 4A.

FIG. 4B is a graph showing a relation between the length of each input power transmission path and the amplitude of an input voltage in the semiconductor device of FIG. 4A. The length of each input power transmission path in FIG. 4B is the distance from a point c which is the open end of a gate finger extending from the first side of the corresponding gate connecting portion to the open end of a gate finger extending from the second side of the same gate connecting portion, i.e. the length (Wgu1×2) which is the total of the lengths of the two gate fingers.

When it is defined in FIGS. 4A and 4B that the X axis direction shows the direction of the length of each input power transmission path, the point c which is the open end of the gate finger extending from the first side of the corresponding gate connecting portion is at X=0, and the open end of the gate finger extending from the second side of the same gate connecting portion is at X=Wgu0. In the semiconductor device of FIG. 4A, the length of the portion of each of the gate fingers, the portion facing a source electrode, is Wgu0. The input voltage amplitude is the RF input voltage amplitude at the point c within each of the gate fingers.

The total finger length Wgt of the semiconductor device shown in FIG. 4A is Wgt=Wgu1×8=(Wgu0/2)×8=4Wgu0, and is the same as the total finger length Wgt(=4Wgu0) of the semiconductor device shown in FIG. 3A. That is, while in the semiconductor device according to Embodiment 1 the total finger length is the same as that in the conventional semiconductor device, the length of each of the gate fingers is one half of that of each of the gate fingers of the conventional semiconductor device.

In the semiconductor device according to Embodiment 1, the length of each of the gate fingers is shorter than that in the conventional semiconductor device. Therefore, as shown by an arrow in FIG. 4B, the degree of nonuniformity of the RF input voltage amplitude within each of the gate fingers is reduced to be less than that in the conventional semiconductor device, and the output power density is improved.

Next, results of performing a simulation of a relation between the length of each input power transmission path and the amplitude of an input voltage in multi-finger transistors will be explained.

Figure 5:
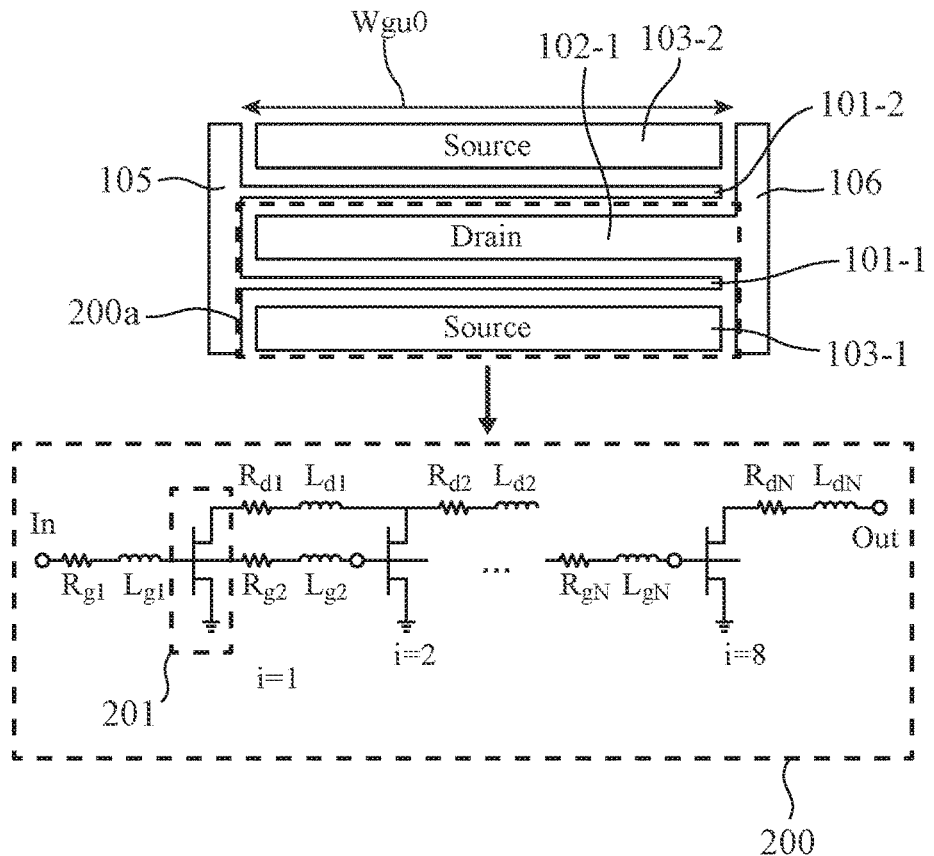
FIG. 5 is a diagram showing an example of a computation model of the electrode structure of a semiconductor device.

FIG. 5 is a diagram showing an example of a computation model of the electrode structure of a semiconductor device, and "Advanced Design System (Keysight Technologies)" is used as simulation software.

In the electrode structure of the multi-finger transistor shown in the upper part of FIG. 5, a portion 200a including one gate finger 101-1, one drain electrode 102 adjacent to this gate finger, and one source electrode 103-1, the portion being enclosed by a broken line, is expressed by the computation model 200 shown in the lower part of FIG. 5. On the other hand, in the semiconductor device according to Embodiment 1, a portion shown in FIG. 1 and including the gate fingers 2-1 and 2-2, the drain electrode 3-1 adjacent to both of these gate fingers, and the source electrodes 4-1 and 4-2 respectively adjacent to the gate fingers 2-1 and 2-2 is expressed by the computation model 200.

For a large signal model 201 which is a base model of the computation model 200, an Angelov-GaN model is used. The computation model 200 is a distributed model in which eight Angelov-GaN models are connected, for each of the gate fingers, via $R_{gi}$ and $R_{di}$ imitating parasitic resistance and $L_{gi}$ and $L_{di}$ (i=1 to 8) imitating inductance components. By expressing each of the gate fingers as the model in which the gate finger is divided into the eight parts, the computation model 200 makes it possible to calculate a distribution of RF input voltage amplitudes within each of the gate fingers.

Figure 6:
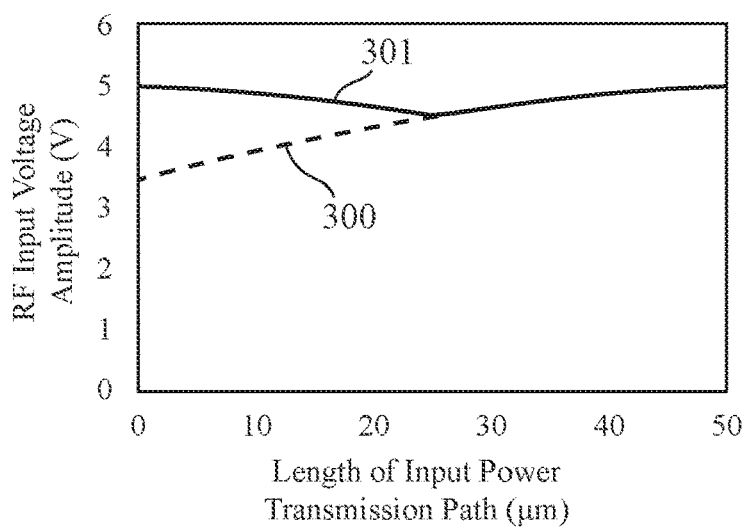
FIG. 6 is a graph showing results of simulation of a relation between the length of each input power transmission path and an RF input voltage amplitude in semiconductor devices.

FIG. 6 is a graph showing the results of the simulation of the relation between the length of each input power transmission path and the RF input voltage amplitude in the semiconductor devices. The results of performing the simulation of the relation between the length of each input power transmission path and the RF input voltage amplitude in the conventional semiconductor device and in the semiconductor device according to Embodiment 1 by using the computation model 200 explained using FIG. 5 are shown.

The length of each input power transmission path in the semiconductor device according to Embodiment 1 is the same as the corresponding length explained using FIG. 4B. More specifically, the point c which is the open end of a gate finger extending from the first side of the corresponding gate connecting portion is at X=0, and the open end of a gate finger extending from the second side of the same gate connecting portion is at X=Wgu0. In contrast, in the conventional semiconductor device, there is a reverse relation to that in the setting of the length explained using FIG. 3B on the simulation, and the point b of each of the gate fingers is at X=Wgu0 and the end point on the root side of the portion in the gate finger, the portion facing a source electrode, is at X=0.

In the simulation result 300 about the conventional semiconductor device, the RF input voltage amplitude drops at a point close to the end point on the root side of the portion in each of the gate fingers shown in FIG. 3A, the portion facing a source electrode, i.e. a point close to X=0, and the RF input voltage amplitude is nonuniform within each of the gate fingers.

In contrast with this, in the simulation result 301 about the semiconductor device according to Embodiment 1, the drop of the RF input voltage amplitude is suppressed also at a point close to the point c(X=0) shown in FIG. 4B. Because in the semiconductor device according to Embodiment 1 the degree of nonuniformity of the RF input voltage amplitude within each of the gate fingers is thus reduced to be less than that in the conventional semiconductor device, the output power density is increased.

As described above, because the semiconductor device according to Embodiment 1 has the electrode structure shown in FIG. 1, the length of each of the gate fingers is short compared with that in conventional semiconductor devices having the same total finger length. As a result, the RF input voltage amplitude within each of the gate fingers is made uniform, and the reduction in the output power density can be suppressed.

Embodiment 2

Figure 7:
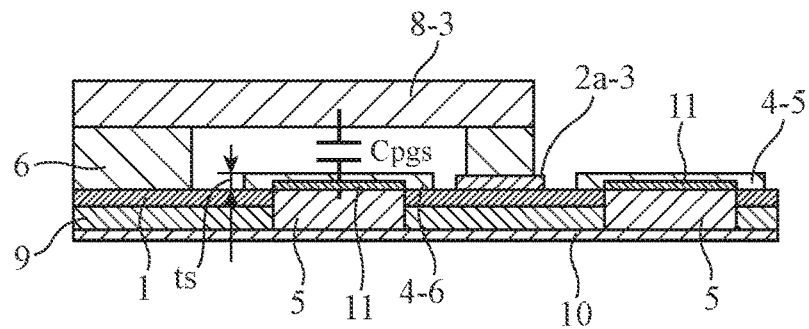
FIG. 7 is a cross-sectional view on arrow showing a cross section of a semiconductor device according to Embodiment 2, taken along the same position as that of the line a-a of FIG. 1.

FIG. 7 is a cross-sectional view on arrow showing a cross section of a semiconductor device according to Embodiment 2, taken along the same position as that of the line a-a in FIG. 1. In FIG. 7, the same components as those shown in FIGS. 1 and 2 are denoted by the same reference signs, and an explanation of the components will be omitted hereinafter. In the semiconductor device according to Embodiment 2, a metal layer 11 is disposed as the lower layer of each of source electrodes 4-5 and 4-6, as shown in FIG. 7. A metal layer 11 is also disposed as the lower layer of each of other source electrodes 4-1 to 4-4.

Each metal layer 11 is formed as the lower layer of one of the source electrodes 4-1 to 4-6 which are formed using plating with metal such as Au, and is formed by a material having a small sputtering yield and making a nonvolatile substance between the material and an etching gas. As such material, for example, one of Cr, Cu, Ni, Al, and so on is provided. Each metal layer 11 formed by this way is more resistant to etching than the source electrodes 4-1 to 4-6, i.e. has high etching resistance.

After the electrode structure of the semiconductor device is formed on a semiconductor layer 1 by a semiconductor process, the semiconductor layer 1 and a substrate 9 are etched in a process of forming vias 5. Because the source electrodes are formed using, for example, plating with Au, there is a possibility that when the etching of the semiconductor layer 1 and the substrate 9 is performed, the source electrodes are removed and the function as the source electrodes is lost because of this etching. In a case in which the thickness ts of each of the source electrodes is designed to be thick so that the function as the source electrodes is not made to be lost by the etching, a capacitance Cpgs formed between each of the source electrodes and a gate air bridge increases, and the high frequency characteristics of the semiconductor device degrade, as described before using FIG. 2.

In contrast with this, the semiconductor device according to Embodiment 2 includes a metal layer 11 as the lower layer of each of the source electrodes 4-1 to 4-6. Because the etching resistance of the metal layer 11 is high compared with that of the source electrodes, the metal layer remains as the lower layer even though the source electrode 4-6 is etched. Because the remaining metal layer 11 functions as the source electrode 4-6, the function of the source electrode 4-6 is maintained even though the etching for forming a via 5 is performed.

As described above, the semiconductor device according to Embodiment 2 includes a metal layer 11 disposed as the lower layer of each of the source electrodes 4-1 to 4-6. Even though the thickness ts of each of the source electrodes is kept thin, the function of each of the source electrodes is maintained by the metal layer 11. As a result, the increase in the capacitance Cpgs is prevented and the degradation in the high frequency characteristics of the semiconductor device is prevented.

Embodiment 3

Figure 8:
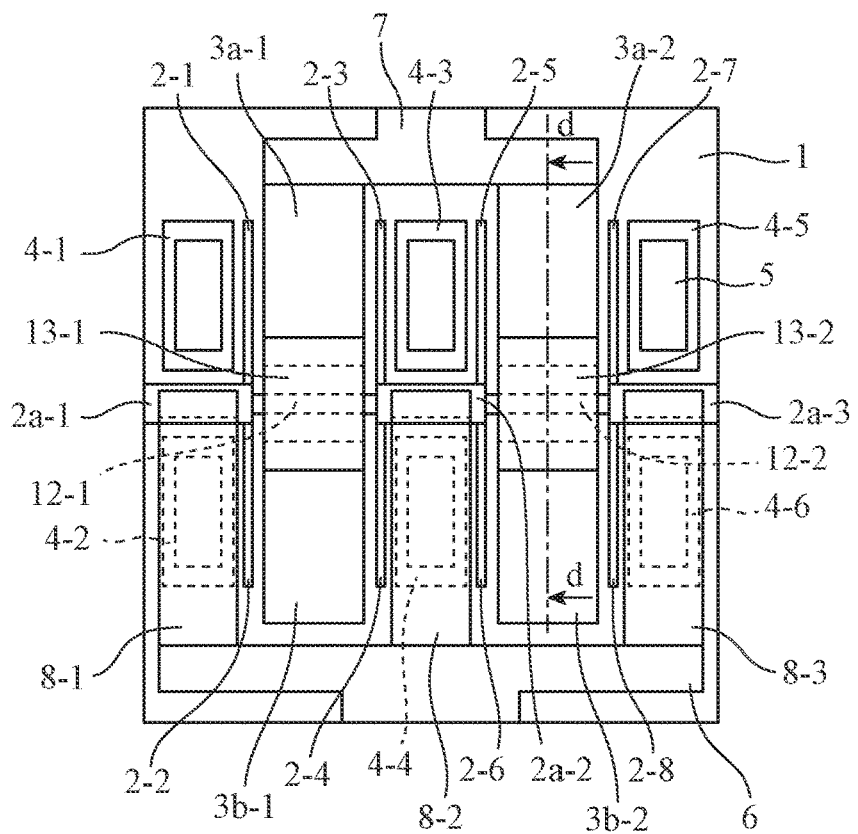
FIG. 8 is a top view showing an example of the structure of a semiconductor device according to Embodiment 3.
Figure 9:
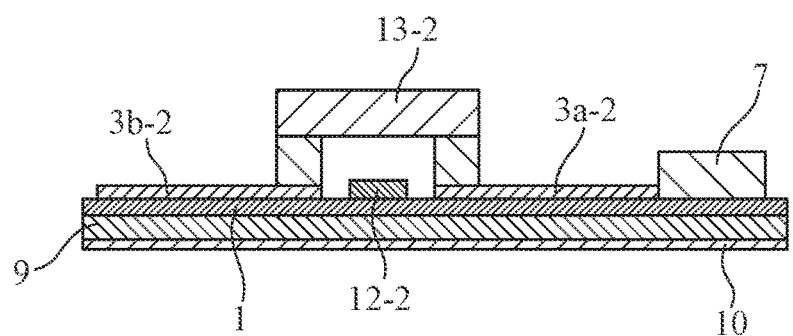
FIG. 9 is a cross-sectional view on arrow showing a cross section of the semiconductor device of FIG. 8, taken along the line d-d.

FIG. 8 is a top view showing an example of the structure of a semiconductor device according to Embodiment 3. FIG. 9 is a cross-sectional view on arrow showing a cross section of the semiconductor device of FIG. 8, taken along the line d-d. In FIGS. 8 and 9, the same components as those shown in FIGS. 1 and 2 are denoted by the same reference signs, and an explanation of the components will be omitted hereinafter. The semiconductor device according to Embodiment 3 is a multi-finger transistor, and includes a semiconductor layer 1, gate fingers 2-1 to 2-8, gate connecting portions 2a-1 to 2a-3, drain electrodes 3a-1, 3b-1, 3a-2, and 3b-2, source electrodes 4-1 to 4-6, vias 5, a gate routing line 6, a drain routing line 7, gate air bridges 8-1 to 8-3, a substrate 9, a ground layer 10, resistors 12-1 and 12-2, and drain air bridges 13-1 and 13-2.

The drain electrode 3a-1 is adjacent to the gate fingers 2-1 and 2-3 extending from the first sides of the gate connecting portions 2a-1 and 2a-2, and the drain electrode 3b-1 is adjacent to the gate fingers 2-2 and 2-4 extending from the second sides of the gate connecting portions 2a-1 and 2a-2. Similarly, the drain electrode 3a-2 is adjacent to the gate fingers 2-5 and 2-7 extending from the first sides of the gate connecting portions 2a-2 and 2a-3, and the drain electrode 3b-2 is adjacent to the gate fingers 2-6 and 2-8 extending from the second sides of the gate connecting portions 2a-2 and 2a-3. Namely, each of the drain electrodes which the semiconductor device according to Embodiment 3 includes is divided into two portions respectively adjacent to both gate fingers extending from the first side of a gate connecting portion and gate fingers extending from the second side of the gate connecting portion.

The resistor 12-1 is an isolation resistor formed on the semiconductor layer 1 and connected between the gate connecting portion 2a-1 and the gate connecting portion 2a-2. The resistor 12-2 is an isolation resistor formed on the semiconductor layer 1 and connected between the gate connecting portion 2a-2 and the gate connecting portion 2a-3. The drain air bridge 13-1 is a first drain air bridge connecting the drain electrode 3a-1 and the drain electrode 3b-1 while straddling the resistor 12-1. The drain air bridge 13-2 is a first drain air bridge connecting the drain electrode 3a-2 and the drain electrode 3b-2 while straddling the resistor 12-2.

As described above, in the semiconductor device according to Embodiment 3, the resistor 12-1 ensures the isolation between the gate connecting portion 2a-1 and the gate connecting portion 2a-2, and the isolation between the gate fingers 2-1 and 2-2 and the gate fingers 2-3 and 2-4, and the resistor 12-2 ensures the isolation between the gate connecting portion 2a-2 and the gate connecting portion 2a-3, and the isolation between the gate fingers 2-5 and 2-6 and the gate fingers 2-7 and 2-8. As a result, in the semiconductor device according to Embodiment 3, internal loop oscillations can be suppressed.

Embodiment 4

Figure 10:
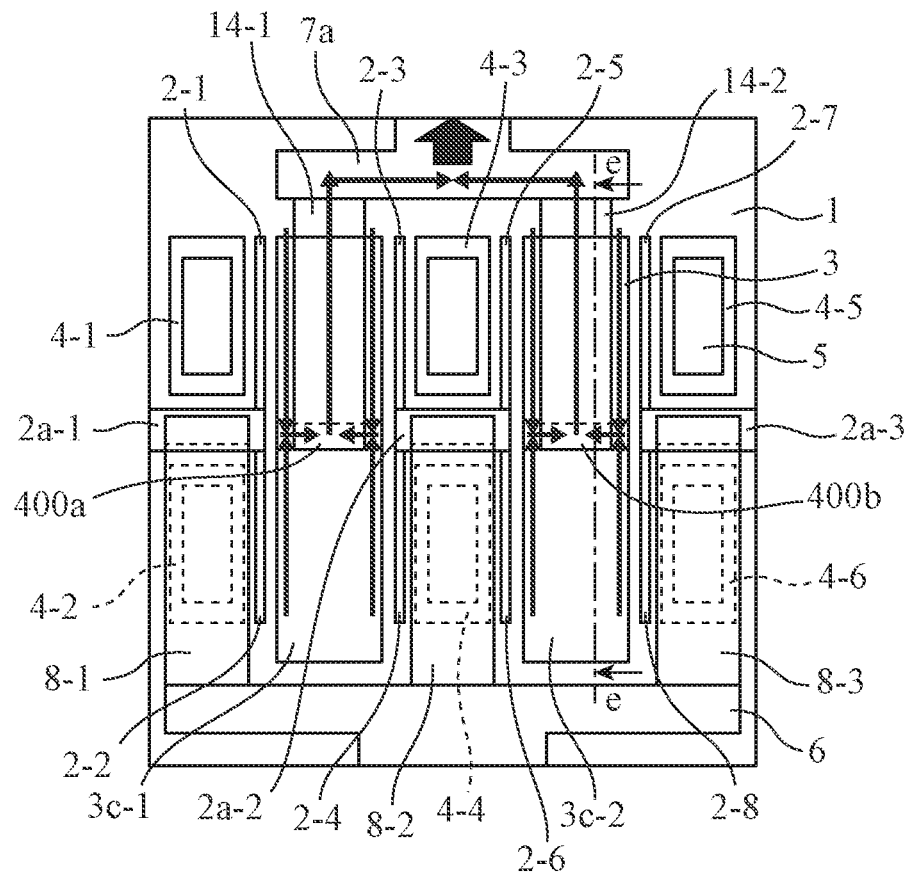
FIG. 10 is a top view showing an example of the structure of a semiconductor device according to Embodiment 4.
Figure 11:
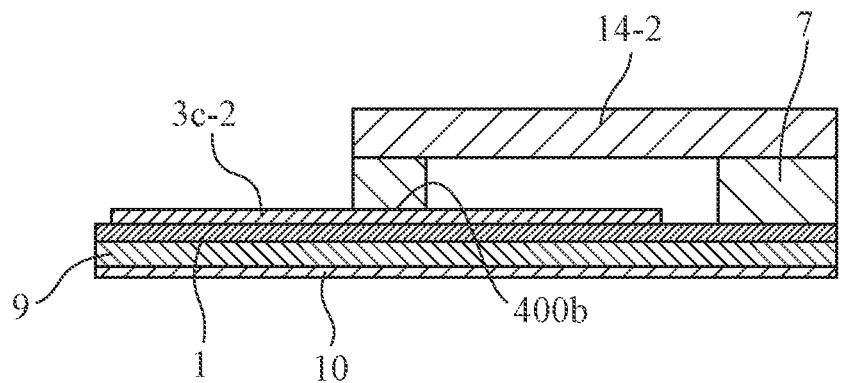
FIG. 11 is a cross-sectional view on arrow showing a cross section of the semiconductor device of FIG. 10, taken along the line e-e.

FIG. 10 is a top view showing an example of the structure of a semiconductor device according to Embodiment 4. FIG. 11 is a cross-sectional view on arrow showing a cross section of the semiconductor device of FIG. 10, taken along the line e-e. In FIGS. 10 and 11, the same components as those shown in FIGS. 1 and 2 are denoted by the same reference signs, and an explanation of the components will be omitted hereinafter. The semiconductor device according to Embodiment 4 is a multi-finger transistor, and includes a semiconductor layer 1, gate fingers 2-1 to 2-8, gate connecting portions 2a-1 to 2a-3, drain electrode 3c-1 and 3c-2, source electrodes 4-1 to 4-6, vias 5, a gate routing line 6, a drain routing line 7, gate air bridges 8-1 to 8-3, a substrate 9, a ground layer 10, and drain air bridges 14-1 and 14-2.

The drain electrode 3c-1 is adjacent to both the gate fingers 2-1 and 2-2 extending from the gate connecting portion 2a-1, and is adjacent to both the gate fingers 2-3 and 2-4 extending from the gate connecting portion 2a-2, as shown in FIG. 10. The drain electrode 3c-1 is not connected directly to the drain routing line 7a on the semiconductor layer 1, but is connected to the drain routing line 7a via the drain air bridge 14-1.

The drain electrode 3c-2 is adjacent to both the gate fingers 2-5 and 2-6 extending from the gate connecting portion 2a-2, and is adjacent to both the gate fingers 2-7 and 2-8 extending from the gate connecting portion 2a-3. The drain electrode 3c-2 is not connected directly to the drain routing line 7a on the semiconductor layer 1, but is connected to the drain routing line 7a via the drain air bridge 14-2, as shown in FIGS. 10 and 11.

The drain air bridge 14-1 is a first drain air bridge connecting between a portion 400a in the drain electrode 3c-1, the portion being adjacent to the gate connecting portions 2a-1 and 2a-2, and the drain routing line 7a, as shown in FIG. 10. The drain air bridge 14-2 is a second drain air bridge connecting between a portion 400b in the drain electrode 3c-2, the portion being adjacent to the gate connecting portions 2a-2 and 2a-3, and the drain routing line 7a.

As described above, in the semiconductor device according to Embodiment 4, input power is transmitted to the gate connecting portions 2a-1 to 2a-3 via the gate air bridges 8-1 to 8-3, and output power is transmitted from the portions 400a and 400b in the drain electrodes 3c-1 and 3c-2, the portions being adjacent to the gate connecting portions, via the drain air bridge 14-1 and 14-2, to the drain routing lines 7a. As a result, because a transmission path for the input power and a transmission path for the output power are substantially symmetrical to each other, the density of output power is further improved.

Embodiment 5

Figure 12:
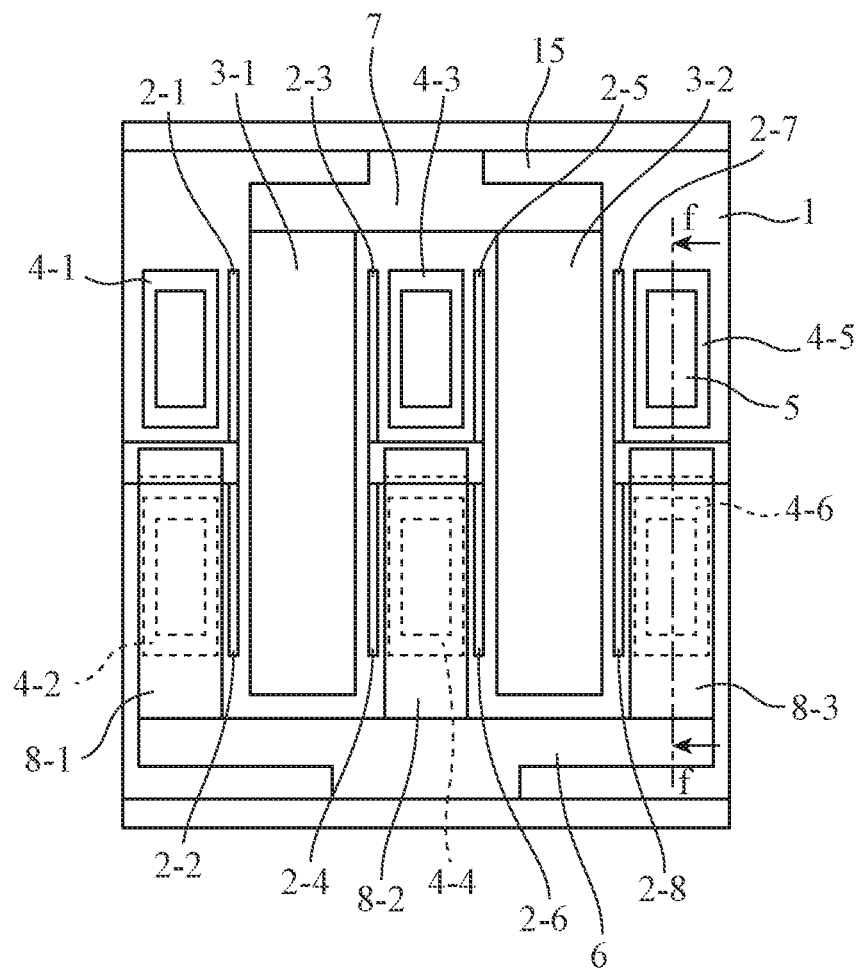
FIG. 12 is a top view showing an example of the structure of a semiconductor device according to Embodiment 5.
Figure 13:
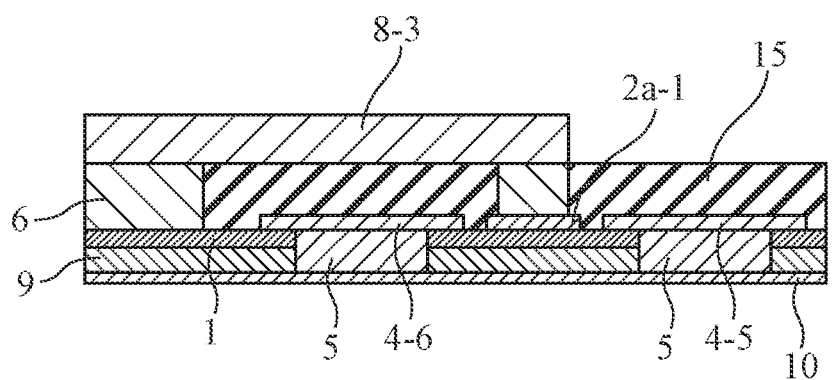
FIG. 13 is a cross-sectional view on arrow showing a cross section of the semiconductor device of FIG. 12, taken along the line f-f.

FIG. 12 is a top view showing an example of the structure of a semiconductor device according to Embodiment 5. FIG. 13 is a cross-sectional view on arrow showing a cross section of the semiconductor device of FIG. 12, taken along the line f-f. In FIGS. 12 and 13, the same components as those shown in FIGS. 1 and 2 are denoted by the same reference signs, and an explanation of the components will be omitted hereinafter. The semiconductor device according to Embodiment 5 is a multi-finger transistor, and includes a semiconductor layer 1, gate fingers 2-1 to 2-8, gate connecting portions 2a-1 to 2a-3, drain electrodes 3-1 and 3-2, source electrodes 4-1 to 4-6, vias 5, a gate routing line 6, a drain routing line 7, gate air bridges 8-1 to 8-3, a substrate 9, a ground layer 10, and an insulation film 15.

The insulation film 15 is disposed under the gate air bridges 8-1 to 8-3, and is formed by an insulating material which has a low dielectric constant so that capacitances Cpgs between the gate air bridges and the source electrodes do not become large. Because the insulation film 15 should just be disposed under at least the gate air bridges, the insulation film may be disposed on the source electrodes 4-1, 4-3, and 4-5 above which the gate air bridges 8-1 to 8-3 are not disposed, as shown in FIGS. 12 and 13.

As described above, the semiconductor device according to Embodiment 5 includes the insulation film 15 disposed under the gate air bridges 8-1 to 8-3. Because of the insulation film 15, the gate air bridges 8-1 to 8-3 can be formed stably in such a way as to be not in contact with the source electrodes 4-2, 4-4, and 4-6. Although the structure in which the insulation film 15 is disposed in the semiconductor device according to Embodiment 1 shown in FIGS. 1 and 2 is shown in FIG. 12, the semiconductor device shown in each of Embodiments 2 to 4 may include the insulation film 15. Also in such a case, the same advantage as above is provided.

Although the multi-finger transistor in which the number of gate fingers is eight is shown in the above explanation, this is only an example. Namely, it is only required for the semiconductor device of any of Embodiments 1 to 5 to be a multi-finger transistor having multiple (two or more) gate fingers.

The present invention is not limited to the above-described embodiments, and any combination of two or more of the above-described embodiments can be made, various changes can be made in any component according to any one of the above-described embodiments, or any component according to any one of the above-described embodiments can be omitted within the scope of the present invention.

INDUSTRIAL APPLICABILITY

Because the semiconductor device according to the present invention can suppress the reduction in the density of output power, it can be used for, for example, high frequency amplifiers.

REFERENCE SIGNS LIST

1 semiconductor layer, 2-1 to 2-8 gate finger, 2a-1 to 2a-3 gate connecting portion, 3-1, 3-2, 3a-1, 3a-2, 3b-1, 3b-2, 3c-1, and 3c-2 drain electrode, 4-1 to 4-6 source electrode, 5 via, 6 and 105 gate routing line, 7, 7a, and 106 drain routing line, 8-1 to 8-3 gate air bridge, 9 substrate, 10 ground layer, 11 metal layer, 12-1 and 12-2 resistor, 13-1, 13-2, 14-1, and 14-2 drain air bridge, 15 insulation film, 100 semiconductor layer, 101-1 to 101-4 gate finger, 102-1 and 102-2 drain electrode, 103-1 to 103-3 source electrode, 104 via, 200 computation model, 200a, 400a, and 400b portion, 201 large signal model, and 300 and 301 simulation result.

The invention claimed is:

1. A semiconductor device comprising:
a semiconductor layer disposed on a substrate;
at least one gate connecting portion disposed on the semiconductor layer;
a plurality of gate fingers extending symmetrically from both sides of the at least one gate connecting portion;
a drain electrode adjacent to both one of the plurality of gate fingers which extends from a first side of the at least one gate connecting portion and another one of the plurality of gate fingers which extends from a second side of the at least one gate connecting portion, the second side being opposite to the first side;
a plurality of source electrodes respectively adjacent to a gate finger among the plurality of gate fingers extending from the first side of the at least one gate connecting portion and another gate finger among the plurality of gate fingers extending from the second side of the at least one gate connecting portion;
a gate routing line via which electric power to be inputted to the plurality of gate fingers is transmitted;
a gate air bridge connecting the at least one gate connecting portion and the gate routing line while straddling a source electrode among the plurality of source electrodes adjacent to said another gate finger extending from the second side of the at least one gate connecting portion; and a metal layer disposed under each of the plurality of source electrodes and having etching resistance higher than etching resistance of the plurality of source electrodes, wherein
the metal layer comprises a first length in a longitudinal direction of the metal layer, and each of the source electrodes comprises a second length in a longitudinal direction of the source electrode, and
the first length of the metal layer is less than the second length of each of the source electrodes.

2. The semiconductor device according to claim 1 further comprising an insulation film disposed under the gate air bridge.

* * * * *